United States Patent
Xi et al.

(10) Patent No.: US 6,856,117 B2
(45) Date of Patent: Feb. 15, 2005

(54) DETECTION CIRCUIT HAVING AN ADAPTIVE THRESHOLD

(75) Inventors: Xiaoyu Xi, Plano, TX (US); Charles Rodriguez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/806,968

(22) Filed: Mar. 23, 2004

(65) Prior Publication Data

US 2004/0245962 A1 Dec. 9, 2004

Related U.S. Application Data

(60) Provisional application No. 60/457,007, filed on Mar. 24, 2003.

(51) Int. Cl.[7] .................. H01M 10/44; H01M 10/46
(52) U.S. Cl. ........................................... 320/128
(58) Field of Search ........................ 320/127, 128, 320/137

(56) References Cited

U.S. PATENT DOCUMENTS 6,614,637 B1 * 9/2003 Smith .................. 361/93.1

* cited by examiner

*Primary Examiner*—Edward H. Tso
(74) *Attorney, Agent, or Firm*—William B. Kempler; W. James Brady, III; Frederick J. Telecky, Jr.

(57) ABSTRACT

A voltage detection circuit utilizes a comparator to compare first and second input voltages to generate a control signal when the difference between the first and second input voltages exceeds a threshold. The threshold voltage is generated by injecting a known current into a resistance in series with one of the inputs. The voltage detection circuit utilizes a first level of injected current when the input differential voltage differs from the threshold by a predetermined voltage level. The injected current rises to a second level as the second input voltage approaches the first input voltage in order to obtain a more accurate voltage comparison.

20 Claims, 3 Drawing Sheets

US 6,856,117 B2

DETECTION CIRCUIT HAVING AN ADAPTIVE THRESHOLD

CROSS-REFERENCED TO RELATED APPLICATIONS

This application claims the benefit of United States patent application Ser. No. 60/457,007, filed on Mar. 24, 2003, which is incorporated herein by reference.

TECHNICAL FIELD OF THE INVENTION

This invention relates to a voltage detector and more specifically to a voltage detector for a battery powered device, such as a cellular telephone.

BACKGROUND OF THE INVENTION

High energy rechargeable batteries have enabled an explosion in small handheld electronic devices such as cellular telephones, PDAs, and two way messaging devices. In these devices, the charging circuit for the rechargeable battery is typically located outside of the device in order to avoid penalizing the device by the size, weight and heat generated by the charging circuit. A cable from the charging circuit will typically plug into a connector on the portable device. Typically a pair of back-to-back-FETs are utilized to permit the battery to be charged, but avoid the possibility of discharging the battery when charger is inactive. An inactive charger may act as a load on the battery. These FETs must be able to withstand the surges associated with battery charging and therefore are relatively large. Eliminating one of these two FETs would reduce the "real estate" utilized by the circuit, and thus reduce the cost of the integrated circuit within the handheld device. If the second FET is omitted, the battery charger pin will rise almost to the battery voltage through the back gate diode of the remaining FET. It is necessary to monitor the charger pin to determine when to keep all circuits off and conserve power, and when to turn on the charging circuitry to replenish the battery.

A circuit to perform this function is shown in FIG. 1A, generally as 100. The circuit comprises a comparator 102 having its non-inverting input coupled to the pin receiving battery voltage VCHGR through a resistance RTH. The inverting input to the comparator is coupled to the pin receiving the battery voltage VBATT. The back gate diode of the FET is shown as 106. In order to establish a threshold voltage which is slightly above the battery the battery voltage, a current IREF is drawn from node 104 by reference generator 108.

FIG. 1B shows the output charger detect voltage (CH_DET) as a function of the input voltage VCHRG. As can be seen from FIG. 1B, once the input voltage rises the threshold voltage above the battery, the output CH_DET from the comparator will change state, and that signal can be utilized to allow the battery charger to charge the internal rechargeable battery in the handheld device. A weakness of the circuit shown in FIG. 1A is that in order to have an accurate threshold voltage which is temperature compensated, the current drawn by the comparator circuit and the reference generator circuit is considerable for a battery powered device. This circuit runs continuously whether or not the handheld device is on. The power consumption of this circuit is critical, because it can noticeably change the usable lifetime of the battery between charges.

SUMMARY OF THE INVENTION

A general object of the present invention is a voltage detector having an adaptive threshold voltage.

This and other objects and features are provided, in accordance with one aspect of the invention by a voltage detector circuit comprising a comparator having a first input coupled to a first voltage source having a first voltage and a second input coupled to a second voltage source having a second voltage to be compared to the first voltage source. A resistance is coupled in series with the second input. A variable current source reference is coupled to the resistance to draw a reference current therethrough to establish a threshold voltage difference between the first and second voltages detected by the comparator. A feedback control signal from the comparator increases the current generated by the variable current source reference as the second voltage approaches the threshold voltage, whereby the voltage detector consumes a lower power when the second voltage is outside the threshold and achieves greater accuracy as the second voltage approaches the threshold.

Another aspect of the invention includes a method of detecting a voltage comprising comparing a first voltage with a second voltage utilizing a comparator detecting a first threshold voltage difference between the first and second voltages. A reference current is injected into the comparator to change the threshold voltage difference detected by the comparator as the second voltage approaches the first voltage, whereby the accuracy of the voltage detection is increased as the second voltage approaches the first voltage.

DETAILED DESCRIPTION OF THE PRESENT INVENTION

Figure 2A:
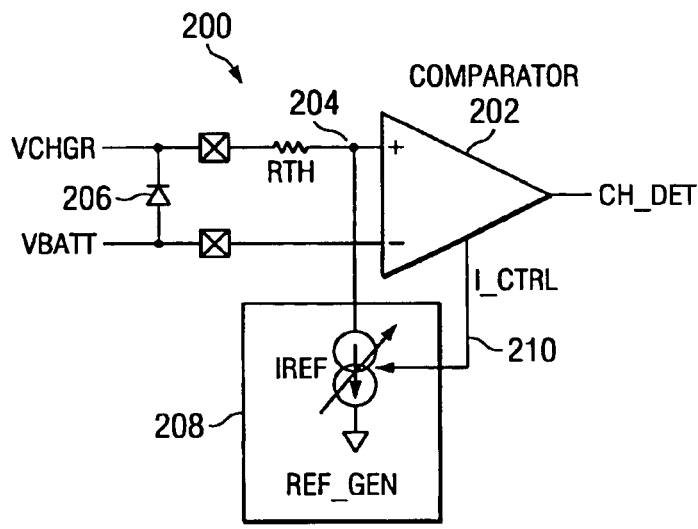
FIG. 2A is a schematic diagram of a voltage detector according to the present invention.

FIG. 2A shows a block diagram of the voltage detector according to the present invention generally as 200. The battery charger voltage VCHRG is applied to the non-inverting input of comparator 202 via series resistance RTH. The battery voltage VBATT is applied to the inverting terminal of comparator 202. Diode 206 represents the back gate diode for the FET. A current reference generator 208 generates a current reference IREF which is drawn through resistance RTH from node 204 to the reference potential. In the circuit shown in FIG. 2A, the reference generator 208 generates a reference current which has two levels, the level of reference current generated by the reference signal generator 208 being dependent upon a control signal I_CTRL output from the comparator on line 210.

Figure 1A:
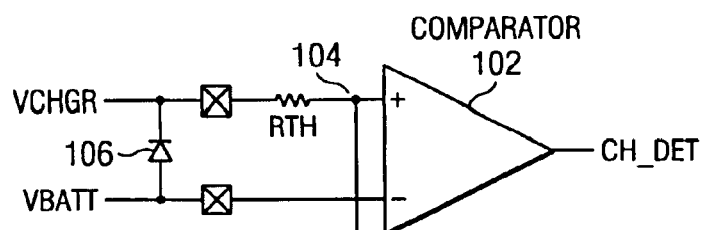
FIG. 1A is a schematic diagram of a known voltage detector circuit.
Figure 1A:
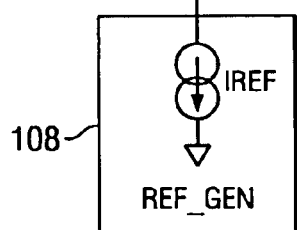
Figure 1B:
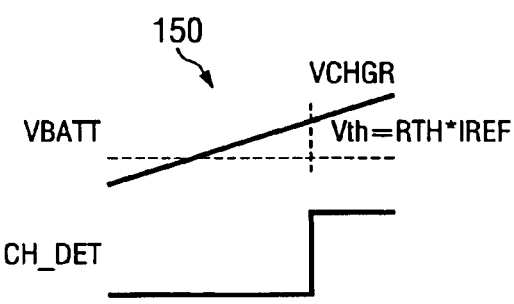
FIG. 1B is a set of waveforms showing the input/output characteristics of the circuit of FIG. 1A.
Figure 2B:
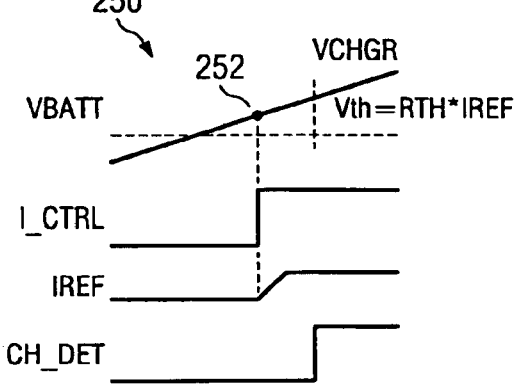
FIG. 2B is a set of waveforms showing the transfer characteristics of the circuit of FIG. 2A.

FIG. 2B represents the waveforms for the apparatus in FIG. 2A as the input voltage VCHRG is raised past the battery voltage VBATT. As can be seen from these waveforms, the signal IREF has two distinct levels and switches in response to the signal I_CTRL. As the voltage VCHRG approaches the threshold voltage, the value I_CTRL switches from a low level to a high level at a predetermined crossover point. This causes the current IREF sunk by the current source IREF generator to increase from a first level to a second level in a linear fashion. The signal I_CTRL switches from the first state to the second state at a point 252 on the VCHRG waveform. The increased current through the reference generator 208 increases the voltage drop across the resistance RTH and thus raises the threshold voltage at which the comparator will change state. As with the circuit shown in FIG. 1A, the threshold voltage VTH is the product of the resistance RTH and the current IREF. Thus, the current IREF is kept small and provides a less accurate threshold detection for the voltage VCHRG until the voltage VCHRG approaches the threshold for the comparator. Then, additional current is drawn through the resistor in order to raise the threshold voltage and thus obtain a more accurate result. When the input voltage VCHRG exceeds the battery voltage by the threshold voltage, the output of the comparator CH_DET switches from a low voltage state to a high voltage state to provide a digital signal indicating that the charger has been connected, and thus allowing the charging of the internal battery. Once the charger has been detected as being present, the hazards created by having an open pin at a voltage very close to the battery has been eliminated as has any current drain through the charging circuit. This eliminates the need for the second FET in the circuit in order to prevent this reverse current flow, which reduces the "real estate" required by the integrated circuit for this device, and thus reduces the cost of the device.

Figure 3:
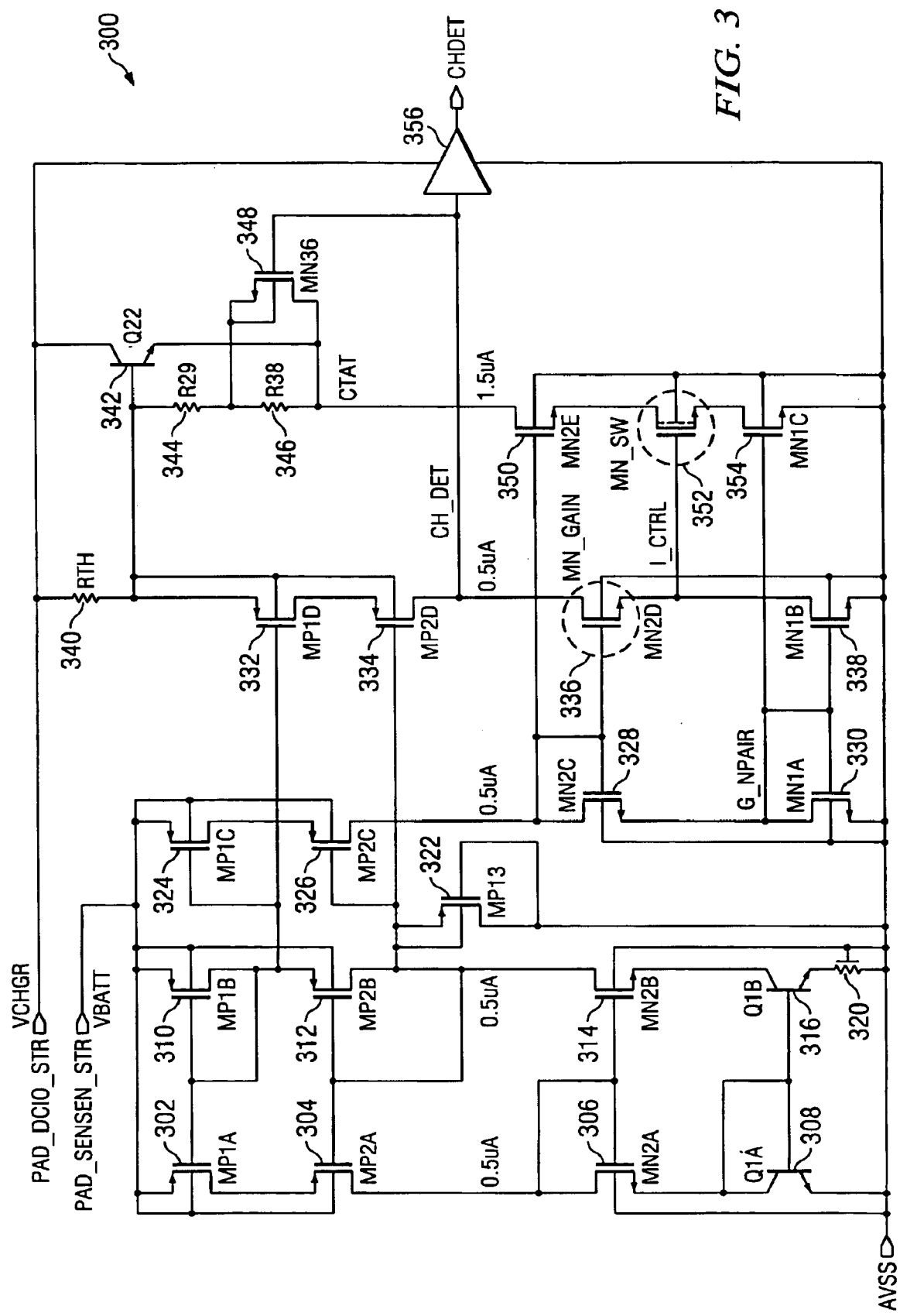
FIG. 3 is a detailed schematic diagram of the voltage detector of the present invention.

FIG. 3 shows a schematic diagram of an implementation of the circuit shown in FIG. 2A generally as 300. PMOS transistor 302 has its source connected to the battery voltage VBATT and its drain connected to the source of PMOS transistor 304 which has its drain connected to the drain of diode connected NMOS transistor 306. The source of NMOS transistor 306 is connected to the collector of diode connected NPN transistor 308. The emitter of transistor 308 is connected to ground. Diode connected PMOS transistor 310 has its source connected to the battery voltage VBATT and its drain connected to the source of diode connected PMOS transistor 312. The gate of transistor 310 is connected to the gate of transistor 302 and the gate of transistor 312 is connected to the gate of transistor 304. The drain of transistor 312 is connected to the drain of NMOS transistor 314 which has its gate connected to the gate of transistor 306. The source of transistor 314 is connected to the collector of NPN transistor 316 the emitter of which is connected through resistance 320 to ground. The base of transistor 316 is connected to the base of transistor 308. The drain of transistor 312 is also connected to the source of diode connected PMOS transistor 322 which has its drain connected to ground.

The source of PMOS transistor 324 is connected to the battery voltage terminal VBATT. The drain of transistor 324 is connected to the source of PMOS transistor 326. The drain of transistor 326 is connected to the drain of diode connected NMOS transistor 328 which has its source connected to the drain of diode connected NMOS transistor 330. The source of transistor 330 is connected to ground. The source of PMOS transistor 332 is coupled to the battery charger voltage VCHRG through resistance RTH. In the illustrated example, RTH is 15 kΩ. The drain of transistor 332 is connected to the source of PMOS transistor 334, the drain of which is connected to the drain of isolated NMOS transistor 336. The gate of transistor 332 is connected to the gate of transistor 324 which is connected to the node between transistors 310 and 312. The gate of transistor 334 is connected to the gate of transistor 326 which is connected to the node between transistors 312 and 314 at which the gate of transistor 322 is connected. The source of transistor 336 connected to the drain NMOS transistor 338, the source of which is connected to ground. The gate of transistor 336 is connected to the gate of transistor 328 and the gate of transistor 338 is connected to the gate of transistor 330. The collector of NPN transistor 342 is connected to the source of battery charger voltage VCHRG and the base thereof is connected to the node between transistor 332 and resistor 340 (RTH). The base of transistor 342 is connected to the series connection of resistors 344 and 346. These resistors are in series with NMOS transistor 350, the drain of which is connected to the resistors and the source of which is connected to the drain of isolated low $V_t$ transistor 352. The gate of transistor 350 is connected to the connected gates of transistors 328 and 336. The gate of transistor 352 is connected to the node of between the source of transistor 336 and the drain of transistor 338. The source of transistor 352 is connected to the drain of NMOS transistor 354, the source of which is connected to ground. The gate of transistor 354 is connected to the connected gates of transistors 330 and 338. The emitter of transistor 342 is connected to the node between resistor 346 and the drain of NMOS transistor 350. An NMOS transistor 348 has its source connected to the node between resistors 344 and 346 and its drain connected to the distal side of resistor 346. The signal CH_DET is generated at the drain of transistor 336 and is connected to the gate of transistor 348 and to the input of an output buffer circuit 356. Output buffer 356 takes the analog voltage developed on line CH_DET and converts that to a digital rail-to-rail signal which can be utilized to operate the switch which controls whether or not the battery can be charged (not shown).

The series connected transistors 302, 304, 306 and 308 produces a current of 0.5 microamps in the circuit as shown. This current is temperature compensated by the diode connected transistor 308. Similarly, the series connected transistors 310, 312, 314, 316 and resistor 320 produce a current of 0.5 microamps through the string. These currents are mirrored in the series connection of transistors 324, 326, 328, 330 and transistors 332, 334, 336, 338 resistor 340 to produce a current of 0.5 microamps through each leg. The leg containing temperature compensating transistor 342, resistors 344, 346 and transistor 350, 352 and 354 produces a current flow of 1.5 microamps.

In operation, the leg containing transistors 302, 304, 306 and 308 will forward bias the diode connected transistor 308. Transistor 316 is made larger than transistor 308, in this example, it is four times larger. It will therefore have a lower $V_{be}$ voltage that transistor 308. The difference between $V_{be}$ voltages of transistors 308 and 316 will appear across resistance 320, which will set the current through the leg containing transistor 310, 312, 314, 316 and resistance 320. This current is then mirrored back to the leg containing transistors 302, 304, 306 and 308 to establish a steady current through the diode connected transistor 308. Thus a stable current source is formed. Transistor 322 is a start up device, that keeps the current source from finding a stable zero current solution. The current through transistor 310 is mirrored in transistors 324 and 332. The current through transistor 312 is mirrored in transistors 326 and 334. Transistors 324 and 326 and transistors 332 and 334 are cascade-connected. When VCHRG is lower than the battery voltage, no current flows in transistors 324, 326, 328, and 330. As the battery charger voltage VCHRG increases, it will first turn on transistors 324, 326, 328, and 3030, then as it continues to rise it will drive more current through transistors 332, 334, 336 and 338. Transistor 352 is a low voltage threshold transistor having a $V_T$ of between 50–400 millivolts. Transistors 330, 338 and 354 are normal NMOS transistors and have a gate voltage labeled G_NPAIR of about 900 millivolts. When the voltage on line I_CTRL reaches approximately 500 millivolts, transistor 352 will be turned on thus drawing current through the additional leg comprising NPN transistor 342, and resistor 344. When the voltage on the line I_CTRL reaches about 900 millivolts, the signal CH_DET will change states because the amount of current that could flow through transistors 332 and 334 exceeds the amount of current that does flow through transistors 336 and 338. The signal CH_DET is input to buffer 356 which converts the voltage change to a rail-to-rail logical voltage which is the output CH_DET of the circuit which is used to change the state of the switch which allows current to flow from VCHGR to the battery.

When the signal CH_DET changes state, transistor 348 is turned off, which places resistor 346 in circuit. This raises the resistance across the base-emitter junction of transistor 342. Since the current through the leg comprising resistors 344 and 346 is determined by transistor 354, which mirrors the current in transistor 330, this increases the base emitter voltage of the base of transistor 342, which draws additional current, thus increasing the threshold slightly. In the example shown, the additional current increases the threshold by about one millivolt, which is enough hysteresis to prevent oscillation of the circuit.

Figure 4A:
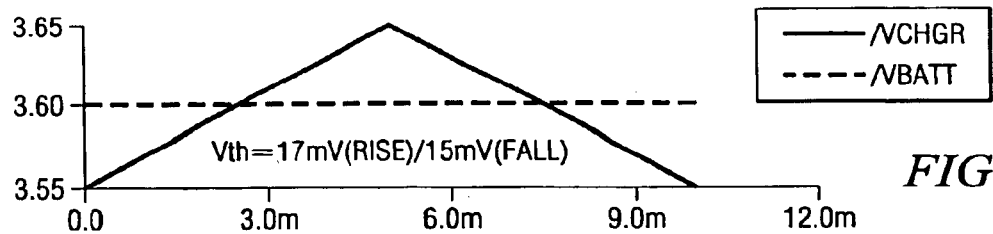
FIG. 4A shows the voltage waveform of signals applied to the voltage detector of FIG. 3.
Figure 4B:
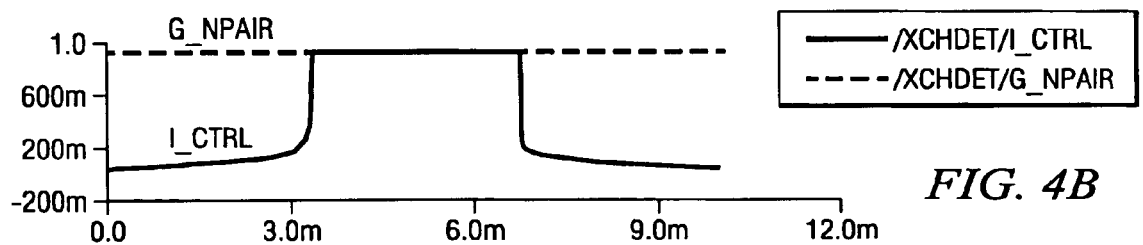
FIG. 4B shows the response of the signal I_CTRL in response to the input of FIG. 4A.
Figure 4C:
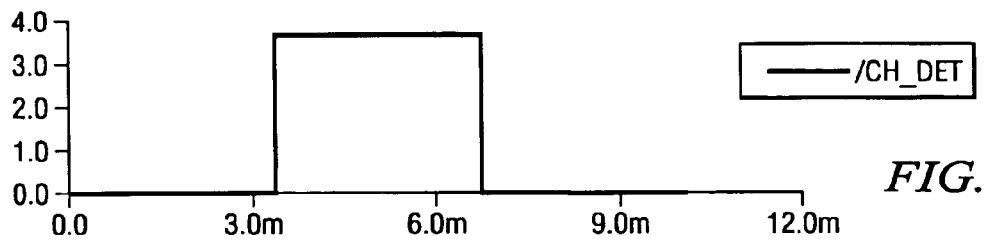
FIG. 4C shows the output waveform of the circuit of FIG. 3 in response to the input of FIG. 4A.
Figure 4D:
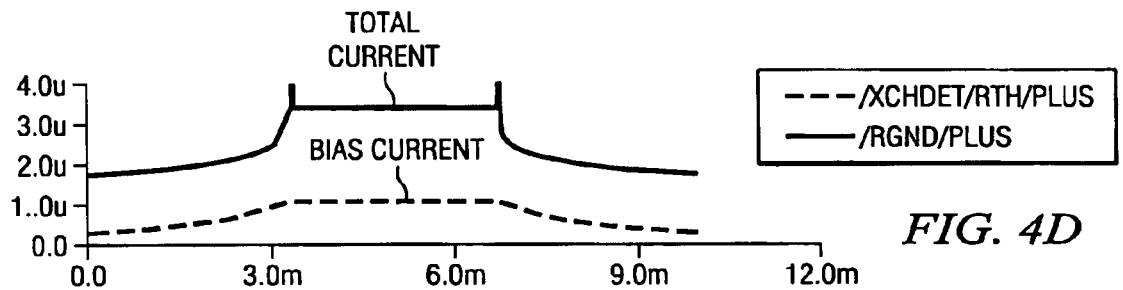
FIG. 4D shows the total quiescent in current drain for the detector and the bias current through the resistor in response to the input shown in FIG. 4A.
Figure 5:
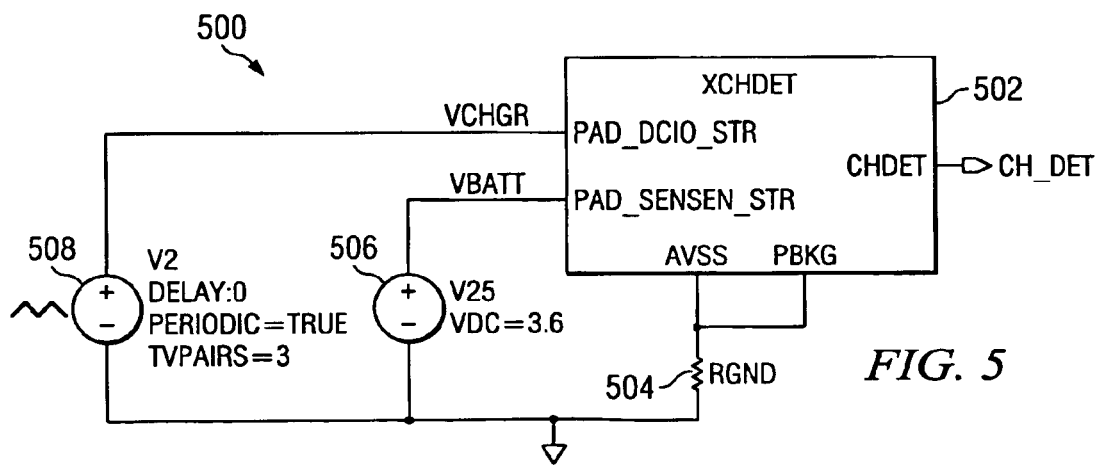
FIG. 5 shows the circuit diagram for the simulation used to generate the waveforms in FIGS. 4A–4D.

FIG. 4A–4D are the simulated waveforms for the circuit of the present invention as shown in FIG. 5. In FIG. 5, the regulator circuits 502 is connected to a battery 506 having a voltage of 3.6 volts. A battery charger 508 is connected to the second input of the device and a small current measuring resistance RGND is connected in the ground return for the circuit.

FIG. 4A shows the battery voltage at a constant 3.6 volts. As the charger voltage VCHGR rises from 3.55 to 3.65 volts and then drops from 3.65 volts back to 3.55 volts, the control voltage I_CTRL rises until it reaches the voltage G_NPAIR when the voltage VCHGR crosses the threshold. The voltage I_CTRL stays at the voltage G_NPAIR until the input charger voltage drops below the threshold voltage, when the voltage starts to drop back to its original value. Referring to FIG. 4C, the signal CH_DET is shown as changing state when the input voltage VCHGR reaches to a threshold voltage above the battery and the signal I_CTRL reaches the value G_NPAIR. The signal CH_DET drops back to 0 once the voltage VCHRG drops to less than the hysterisis adjusted threshold above the battery and the signal I_CTRL drops below G_NPAIR.

FIG. 4D shows the current waveform for the device. The upper curve shows the total quiescent current as a level that starts out below 2 micoramps and then rises to a level of 4 microamps as the voltage VCHGR crosses the threshold. It can also be seen that the bias current through the resistor RTH starts out at about 0.3 microamps and rises to about 1 microamp as the voltage VCHGR approaches the threshold and while it is at the threshold voltage.

Once the voltage VCHGR has reached the threshold, which determines that a charging circuit has been attached to the portable device, the power penalty of drawing the additional current is of no consequence, because the power is supplied by the charger. The charger is either plugged into a wall outlet or into a power outlet in an automobile, or the USB hub of a PC, and the difference in current is of no consequence. It should also be noted, that as the input voltage VCHGR approaches the threshold and while it is at or above the threshold, the current through the transistor 342 will temperature compensate the threshold level. Again, the additional power consumed in order to maintain an accurate threshold is of no consequence if a charger is actually connected to the portable device.

While the invention has been shown and described with reference to preferred embodiments thereof, it is well understood by those skilled in the art that various changes and modifications can be made in the invention without departing from the spirit and scope of the invention as defined by the appended claims. For example the values of resistors 320, 344 and 346 can be increased so that the quiescent current drawn by the circuit is reduced to about 1 microampere. This results in a small loss of accuracy in the threshold level, which may be an acceptable trade off for halving the quiescent current drawn by the circuit.

What is claimed is:

1. A voltage detector circuit comprising:
   a comparator having a first input coupled to a first voltage source having a first voltage and a second input coupled to a second voltage source having a second voltage to be compared to the first voltage source, a resistance being coupled in series with the second input;
   a variable current source reference coupled to the resistance to draw a reference current therethrough to establish a threshold voltage difference between the first and second voltages detected by the comparator; and
   a feedback control signal from the comparator for increasing the current generated by the variable current source reference as the second voltage approaches the threshold voltage, whereby the voltage detector consumes a lower power when the second voltage is outside the threshold and achieves greater accuracy as the second voltage approaches the threshold.

2. The voltage detector circuit of claim 1 wherein the first voltage is a battery voltage and the second voltage is an output of a battery charger.

3. The voltage detector circuit of claim 2 wherein an output of the comparator controls operation of the battery charger.

4. The voltage detector circuit of claim 1 in which the circuit is in a cellular telephone.

5. The voltage detector circuit of claim 2 in which the circuit is in a cellular telephone.

6. The voltage detector circuit of claim 3 in which the circuit is in a cellular telephone.

7. The voltage detector of claim 4 wherein the circuit is powered by the cellular telephone battery.

8. The voltage detector of claim 5 wherein the circuit is powered by the cellular telephone battery.

9. The voltage detector of claim 6 wherein the circuit is powered by the cellular telephone battery.

10. The voltage detector of claim 1 wherein the increased current is temperature compensated.

11. A method of detecting a voltage comprising:
    comparing a first voltage with a second voltage utilizing a comparator detecting a first threshold voltage difference between the first and second voltages;

injecting a reference current into the comparator to change the threshold voltage difference detected by the comparator as the second voltage approaches the first voltage, whereby the accuracy of the voltage detection is increased as the second voltage approaches the first voltage.

12. The method of claim 11 wherein the injected reference current is generated by a variable current source.

13. The method of claim 12 wherein the variable current source generates a first injected reference current when the second voltage is different from the first voltage by a predetermined voltage level, the injected current increasing from the first level as the second voltage approaches the first voltage.

14. The method of claim 11 wherein the first voltage is a battery voltage and the second voltage is an output of a battery charger.

15. The method of claim 14 wherein an output of the comparator controls operation of the battery charger.

16. The method of claim 12 wherein the comparator and variable current source is in a cellular telephone.

17. The method of claim 16 wherein the comparator and variable current source is powered by the cellular telephone battery.

18. The method of claim 11 wherein the injected current is temperature compensated.

19. The method of claim 11 wherein the injected current is drawn through a resistance in series with the first or the second voltage.

20. The method of claim 14 wherein the injected current is drawn through a resistance in series with the output of the battery charger.

* * * * *